United States Patent [19]

Buchholtz et al.

[11] Patent Number: 4,942,399
[45] Date of Patent: Jul. 17, 1990

[54] ADAPTIVE FLASH ANALOG/DIGITAL CONVERTER FOR DIFFERENTIAL INPUT SIGNAL

[75] Inventors: Timothy C. Buchholtz; Michael R. Gruver; Raymond A. Richetta, all of Rochester; Timothy J. Schmerbeck, Kasson, all of Minn.

[73] Assignee: International Business Machines Corporation, Armonk, N.Y.

[21] Appl. No.: 324,267

[22] Filed: Mar. 15, 1989

[51] Int. Cl.$^5$ ............................................. H03M 1/36
[52] U.S. Cl. ................................... 341/143; 341/159; 341/135
[58] Field of Search ............... 341/143, 159, 155, 135, 341/136, 126

[56] References Cited

U.S. PATENT DOCUMENTS

| | | | |
|---|---|---|---|
| 4,229,729 | 10/1980 | Devendorf et al. | 341/159 |
| 4,649,372 | 3/1987 | Abe et al. | 341/136 |
| 4,777,472 | 10/1988 | Sauer et al. | 341/143 |

Primary Examiner—William M. Shoop, Jr.
Assistant Examiner—Sharon D. Logan
Attorney, Agent, or Firm—J. Michael Anglin

[57] ABSTRACT

A differential analog input signal is level-shifted and converted to single-ended form. Its average value is compared to the midpoint of a set of reference voltages. A control signal proportional to the average value forces the average of the single-ended signal toward the midpoint voltage. The single-ended signal is converted to uncoded digital form by a parallel comparator bank, and is then converted to coded digital form.

9 Claims, 7 Drawing Sheets

ADAPTIVE FLASH ANALOG/DIGITAL CONVERTER FOR DIFFERENTIAL INPUT SIGNAL

BACKGROUND

The present invention relates to electrical circuits, and more particularly concerns a high-speed analog/digital converter (ADC) for converting a differential input signal into digital form.

In many applications, differential signals are preferred to single-ended analog signals. Differential signals have better noise rejection for low-level signals, and less pickup in high-impedance circuits, for example.

Conversion of differential signals to digital form, however, presents unique problems. Differential signals usually float with respect to any fixed reference voltage such as ground potential or the set of fixed voltages which must be used to compare against the analog signal. The average value of the input signal may vary from a nominal zero value, thus moving the entire signal up and down unpredictably against the fixed reference voltages.

The prior art in this general area has never faced these problems directly. U.S. Pat. No. 4,578,715 to Yamaguchi deals with a single-ended, ground-referenced analog signal so that its peak value always lies within the range of the reference voltages in an ADC. U.S. Pat. No. 4,110,745 to Ninomiya clamps the lowest voltage of an analog input in an ADC, using a known point in the signal. U.S. Pat. No. 3,544,779 to Farrow senses the average value of a single-ended analog input, but uses this average only to vary the various slicing levels of an ADC.

SUMMARY OF THE INVENTION

The present invention allows a differential input signal having a nonzero average value to be converted to a digital level such that the average value of the input always falls at a constant digital value in the output. The circuit operates at high speed. It is inexpensive and requires no precision components. With the exception of a capacitor, it may be integrated in a singular chip.

Broadly speaking, the invention achieves these and other goals by combining a level shifter, a converter for translating the differential signal into single-ended form, a reference generator, a comparator bank, a differencing circuit responsive to both the converter and the reference generator, and a control circuit. The control circuit produces a control signal proportional to the average of the differential input, and applies it to the converter so as to drive the average value of the single-ended analog signal toward a midpoint level of the reference generator.

DRAWING

DESCRIPTION OF THE PREFERRED EMBODIMENT

Figure 1A:
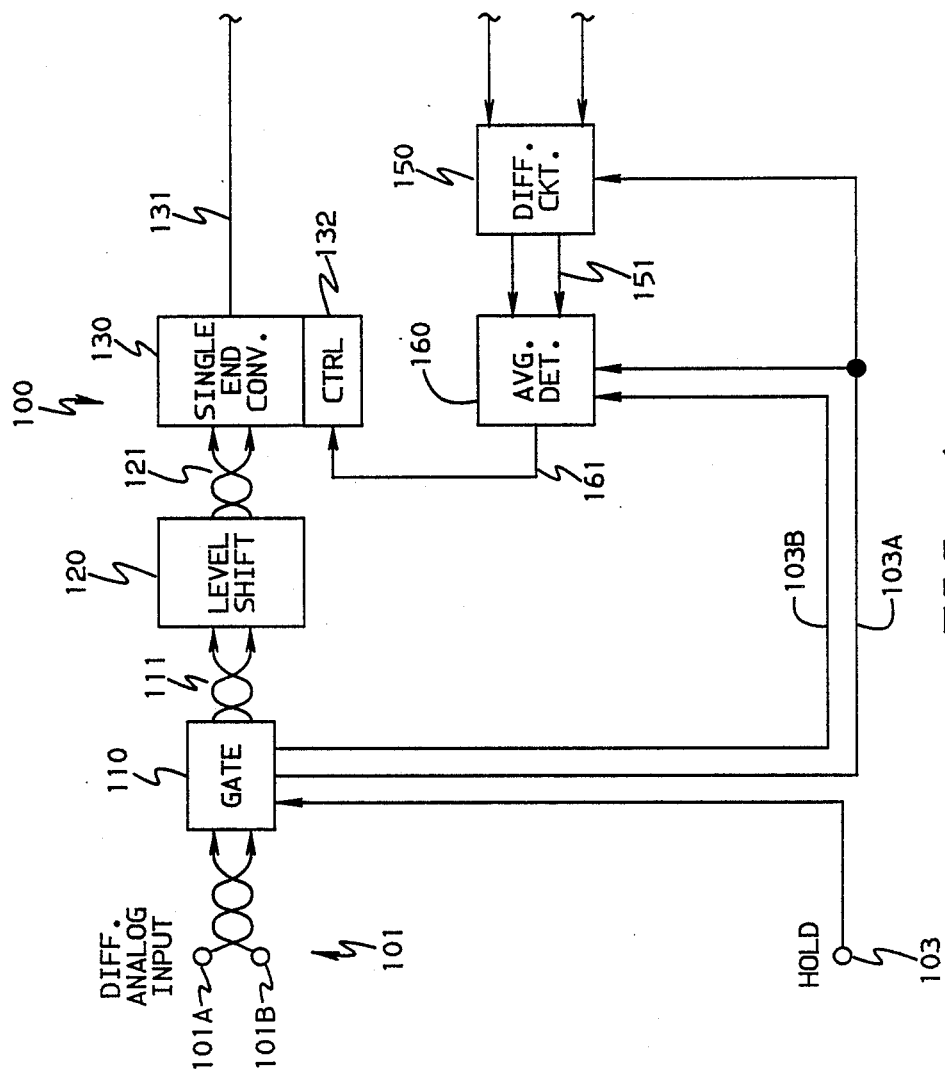
FIG. 1a and 1b is a block diagram of an analog/digital converter according to the invention.
Figure 1B:
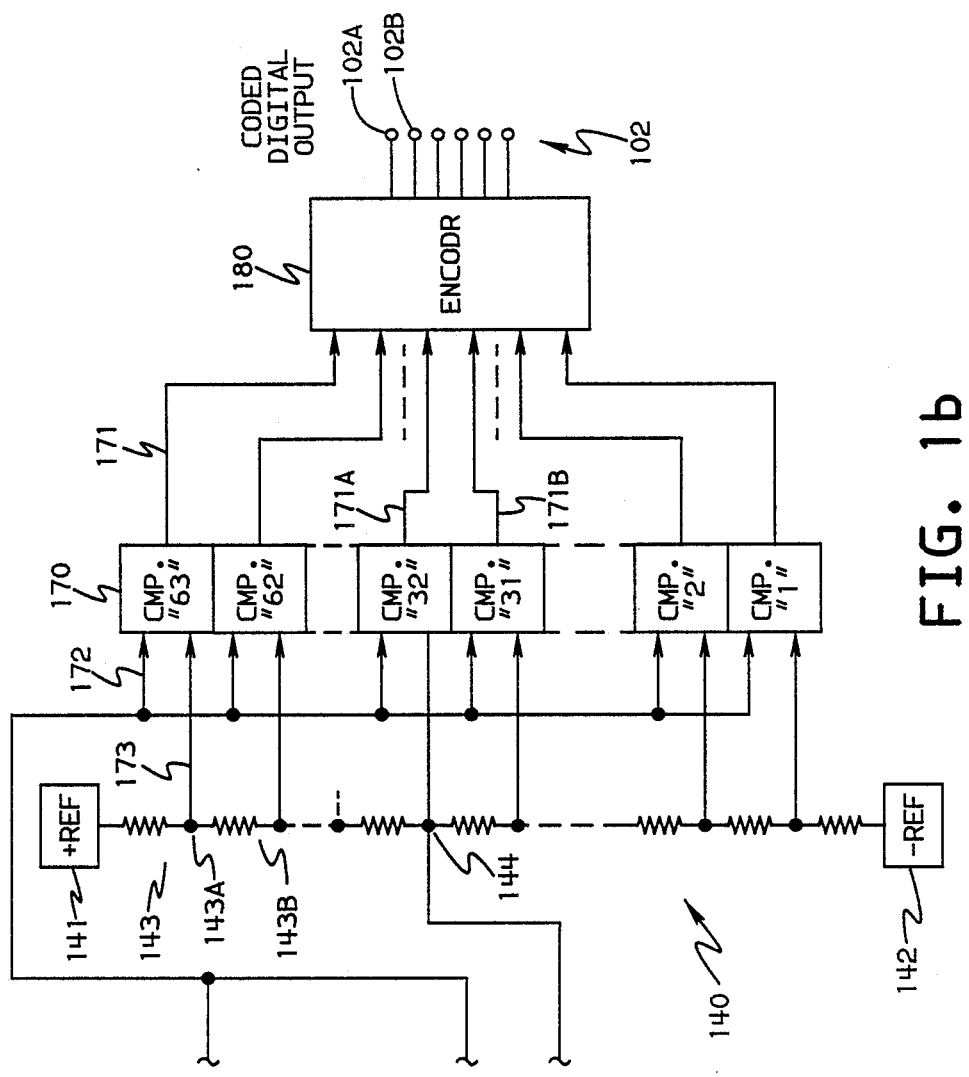

FIG. 1 shows an analog/digital converter (ADC) 100 constructed according to the invention. This embodiment is particularly useful for converting an amplified, filtered, AC-coupled high-frequency differential analog signal from the read head of a fixed-disk drive into a 64-level digital signal for further conversion by a digital circuit (not shown) into a single-bit pulse train representing the data on the disk. A zero amplitude of the voltage between the two leads of the differential input signal is represented by a dance between the 31 code and the 32 code of the 6-bit coded digital output.

Differential input signal 101 is the voltage difference between lines 101A and 101B. The voltages on these two lines are AC-coupled from previous stages (not shown), and may vary with respect to an external ground reference, without any effect on the digital output 102. The voltage difference between the lines may also have a non-zero average value, which converter 100 must remove before the signal reaches output 102.

Input 101 first enters a gate circuit 110. External HOLD signal 103 disables this gate when it has a logic high value. Signal 103 prevents the remainder of the converter 100 from erroneously processing the input signal during periods when it is meaningless, such as when no data is being read from the disk drive. Gate 110 also produces two phases 103A and 103B of the HOLD signal, for use by other blocks.

Level shifter 120 receives the gated differential output signal 111, and moves its base level to a known point from a constant external reference voltage.

Single-end converter 130 converts the shifted differential analog signal 121 from shifter 120 to a single-ended analog signal 131, which varies about a value fixed with respect to a ground reference voltage. This unit includes a level control circuit 132 for varying the output voltage up or down with respect to the ground level in response to a control signal.

Reference generator 140 produces a number of graduated reference voltages between a fixed upper reference voltage 141 and a fixed lower reference voltage 142. A conventional resistor ladder 143 produces 64 equal voltage steps 143A, 143B, etc., between the two fixed reference voltages. A tap 144 at the midpoint of ladder 143 produces a midpoint reference voltage exactly half-way between the upper and lower references. All of these voltages are measured with respect to a ground voltage.

Differencing circuit 150 compares the instantaneous value of the single-ended analog signal 131 with the fixed midpoint reference voltage signal 144. Difference output 151 is a signal representing both the magnitude and the direction of the difference between these two signals. HOLD phase 103A disables circuit 150 when HOLD input 103 is high.

Average detector 160 produces a control signal 161 corresponding to the average value of the difference output 151. This signal represents the amount above or below the midpoint reference of a short-term average of the analog signal 131, which in turn represents the average value of the input signal 101. HOLD phases 103A and 103B cut off detector 160 when HOLD input 103 is high; at such times, the level of control signal 161 is held constant. Control signal 161 drives control circuit 132 to raise and lower the level of analog output 131 so that its average value conforms to the voltage of the midpoint voltage of reference ladder 140.

A bank of sixty-three comparators 170 produce digital signals 171 having a high level whenever the ground-referenced analog signal 131 at inputs 172 is higher than the voltage of a respective tap 143A, 143B, etc., coupled to inputs 173. Therefore, all 63 of the outputs 171 are high when the analog signal is at least 63/64 of the difference between the upper and lower fixed reference voltages; the upper line is low and the lower 63 lines are high when the analog signal is between 62/63 and 63/64 of this difference, and so forth. That is, lines 171 carry an uncoded X-of-N or X/N digital signal. This type of analog/digital converter is known as a "flash" converter, because all the uncoded outputs 171 are produced in parallel and simultaneously, without any intermediate coding or differencing.

In this implementation, the midpoint 144 between the upper and lower reference voltages lies exactly on the junction between the 32nd and the 33rd resistors of ladder 143. This point is also the reference point for the 32nd comparator, whose output is 171A. When the signals at 131 and 144 are exactly equal, this comparator has a zero differential voltage, so that output 171A can be either high or low. That is, the zero average value of the analog input 101 corresponds to an output digital value halfway between "31" and "32." Line 171B is always high at this exact value, and line 171B alternates equally between high and low.

Digital encoder 180 is a conventional logic circuit for converting the 63 X/N outputs into a six-bit coded digital output 102 on lines 102A, 102B, etc.

Figure 2:
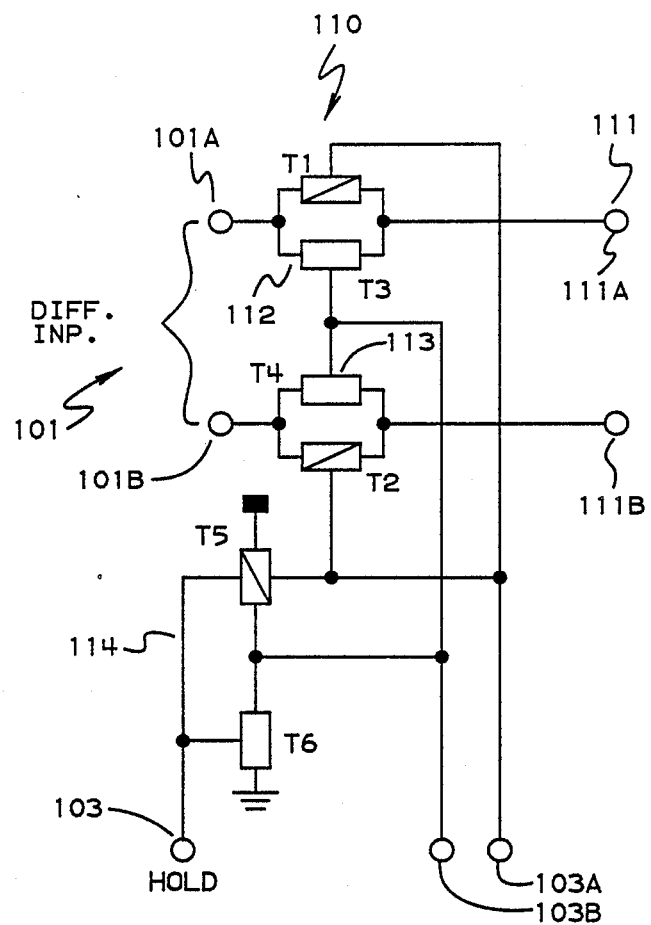
FIG. 2 is a diagram of the gate circuit of FIG. 1.

FIG. 2 is a circuit diagram of gate 110, FIG. 1. Input line 101A passes through a conventional transmission gate or switch 112 made up of P-channel field-effect transistor (PFET) T1 and N-channel FET (NFET) T3 to gated output line 111A. Line 101B passes through an identical gate 113 comprising PFET T2 and NFET T4. FETs T5 and T6 form an inverter 114 for converting HOLD input 103 into two complementary phases on lines 103A and 103B. (The ground symbol represents a common voltage; the square filled terminal represents a positive supple voltage of about 5 V.) When HOLD 103 is low, the transmission gates pass the signals 101A and 101B to lines 111A and 111B; when it is high, lines 111 are open-circuited. Phases 103A and 103B are also passed to other circuits, as shown in FIG. 1.

Figure 3:
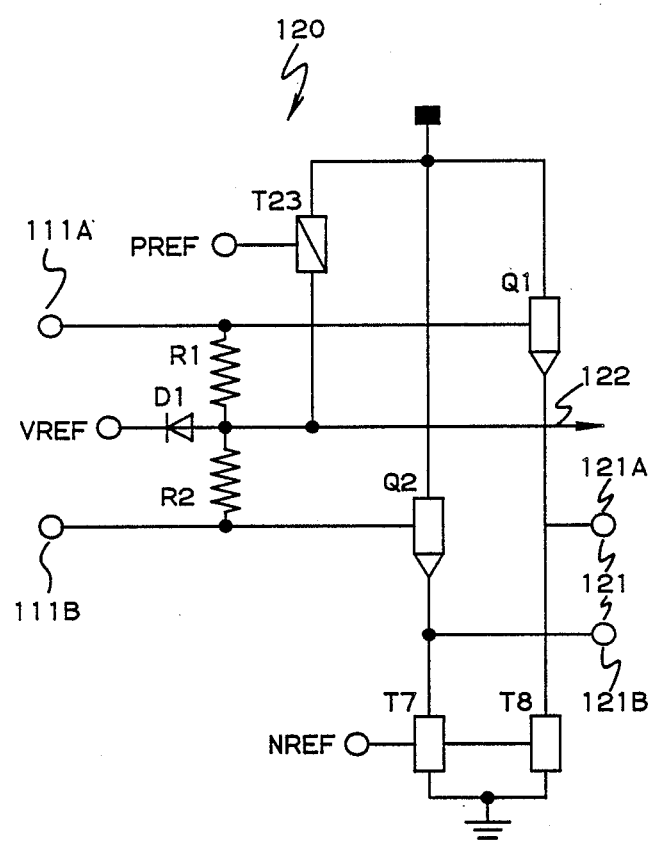
FIG. 3 is a circuit diagram of the level shifter of FIG. 1.

FIG. 3 is a diagram of circuit 120, FIG. 1 for shifting the DC level of its differential inputs to a new DC reference point at output lines 121A and 121B. VREF is a constant reference voltage of about 2.25 V, and is coupled to lines 111A and 111B through diode D1 and resistors R1 and R2. PFET T23 maintains 1 mA of current flowing through D1 to maintain line 122 at this voltage. Its gate is coupled to a constant P-channel voltage PREF. NPN bipolar transistors Q1 and Q2 form emitter followers for another level shift to lines 121A and 121B. T7 and T8 maintain a constant current in the emitter followers. Their gates receive a constant N-channel voltage NREF.

Figure 4:
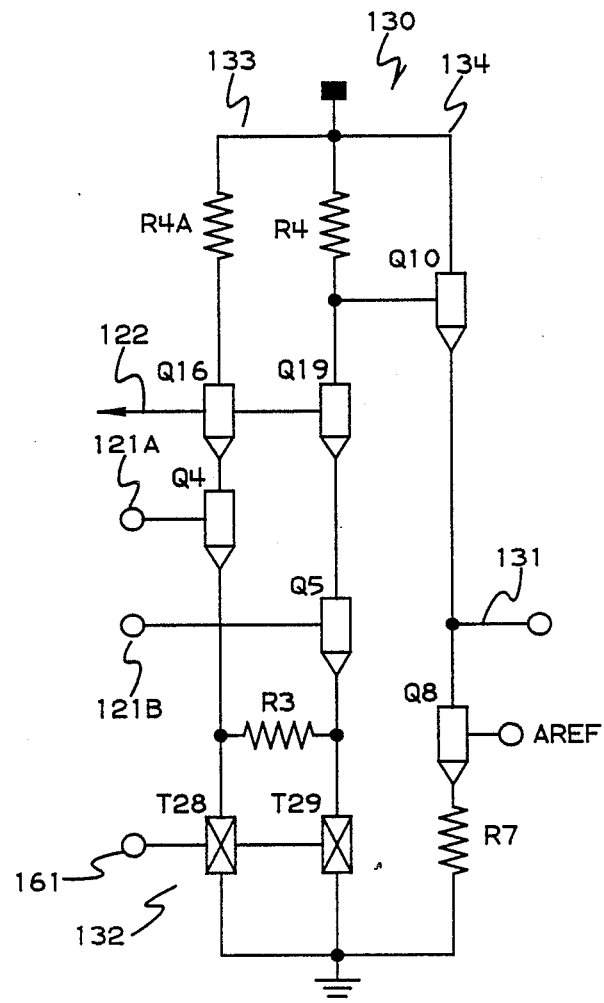
FIG. 4 is a diagram of the single-ended converter of FIG. 1.

FIG. 4 shows a level converter 130, FIG. 1. The differential signal on lines 121A and 121B connect to the bases of Q4 and Q5 of a differential amplifier 132. Load resistors R4 and R4A, and emitter gain resistor R3 are also included in differential amplifier 133. Q16 and Q19 receive the reference voltage on line 122 from level-shifter 120, FIG. 3. Q16 and Q19 form a cascade stage for Q4 and Q5. This increases the bandwidth of the stage 133 by reducing the Miller capacitance of Q4 and Q5. Low-threshold FETs (LFETs) T28 and T29 supply identical currents in the two legs of the differential amplifier. (An LFET is either an N- or P-channel FET doped to have a turn-on threshold voltage anywhere between that of a full enhancement-mode and a full depletion-mode FET. T28 and T29 are N-channel, zero-threshold LFETS.) A single-ended signal is taken from amplifier 133 at the junction of R4 and the collector of Q19. Q10 buffers the nascent single-ended signal in an emitter follower 134. Q8 and R7 form a current source in the emitter follower; Q7's base receives a constant voltage AREF. The buffered single-ended signal then appears on line 131.

The overall signal gain of this implementation, from input 102 to line 131, is about 0.95. Higher or lower gains could be used for amplification or prescaling.

Figure 5:
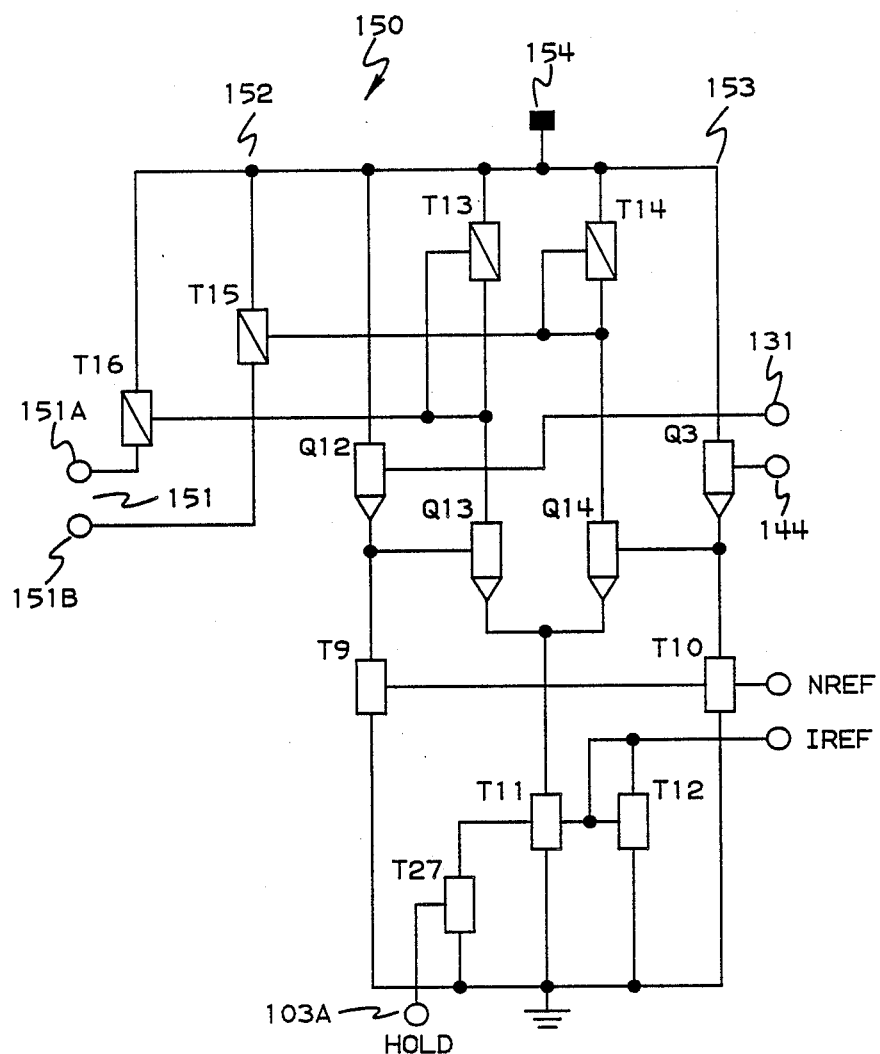
FIG. 5 shows the differencing circuit of FIG. 1.

FIG. 5 details the differencing circuit 150 of FIG. 1. Emitter follower 152 comprises Q12 and current-source FET T9, and buffers the single-ended analog voltage on line 131. Emitter follower 153 performs the same function for the ladder midpoint voltage on line 144; it includes Q3 and current-source FET T10. The gates of T9 and T10 connect to the constant NREF voltage. The level-shifted outputs of emitter followers 152 and 153 connect to the bases of transistors Q13 and Q14 of a differential amplifier 154. A current mirror formed of T11 and T12 forces a constant 0.2 mA total current from terminal IREF into the pair of amplifier transistors Q13 and Q14. T27 shuts off amplifier 154 when HOLD phase 103A is high, by diverting the entire current to ground. The differential outputs on lines 151A and 151B are the currents flowing through Q13 and Q14. These currents are obtained by current mirrors comprising T13, T16 and T14, T15.

Figure 6:
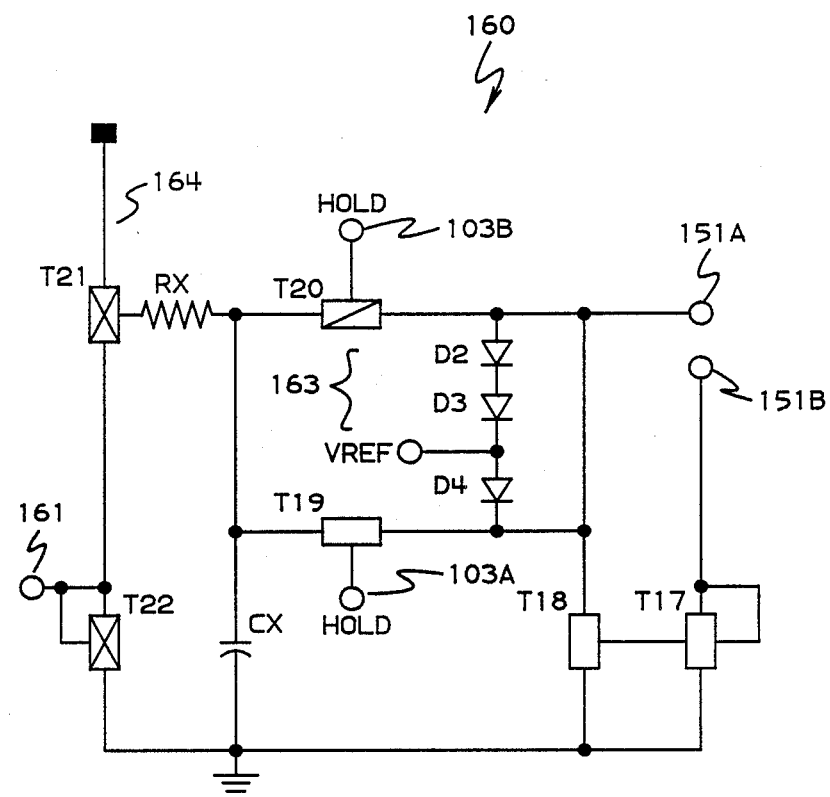
FIG. 6 is a diagram of the average detector of FIG. 1.

FIG. 6 shows the average detector 160 of FIG. 1. A current mirror comprising T17 and T18 is connected to lines 151A and 151B so as to produce a current in T16 proportional to the current in Q13, and a current in T18 proportional to the current through Q14. The combined current in T16 and T18 can be of either polarity. Diodes D2, D3 and D4 are coupled to constant voltage VREF to clamp the voltage excursion at the drain of T18, so as to maintain enough drain/source voltage across T16 and T18. Transmission gate 163 comprises T19 and T20 coupled to HOLD phases 103A and 103B. When HOLD signal 103 is low, gate 163 passes the current derived from Q13 and Q14, FIG. 5, to an external storage capacitor Cx. This changes the voltage on the capacitor. Since the current can flow both into and out of the capacitor, its voltage can both increase and decrease. Therefore, the voltage on capacitor Cx represents and stores the average value of the differential input signal 101. This voltage appears at the gate of source-follower LFET T21. (Resistor Rx is only for protection against electrostatic discharges.) Another LFET, T22, forms a current generator for producing a current proportional to the voltage on Cx. That is, T21 and T22 form a converter 164 for transforming the voltage across Cx into a single-direction current representing that voltage. T21 and T22 are N-channel, zero-threshold devices.

Taken together, T22 of FIG. 6 and T28, T29 of FIG. 3 form a dual current mirror for controlling the voltage level of line 131 in accordance with the average value of the input signal 101, as represented by the voltage on Cx. The geometry of T22 is selected to achieve about a 5:1 current multiplication of the current in converter 164 into both FET T28 and FET T29 of level-control circuit 132. Thus, the current in each leg of differential amplifier 133 changes equally with changes in the control current in line 161, and thus changes the voltage levels of lines 121A and 121B equally. The overall compensation operation is as follows. If line 131 is at a voltage lower than that of midpoint 144, then Q14's collector current is larger than Q13's, current is pulled out of Cx, and the voltage across Cx decreases. This lowers the current in T29, which reduces the voltage drop across R4, raising the voltage into the base of Q10 and thus the DC level of the output voltage 131. The signal voltage on line 131 thus swings about a higher base level. In the same manner, a DC level on line 131 less than the midpoint voltage 144 reduces the DC level on line 131.

The values of capacitor Cx and current IREF are chosen so that the compensation loop cannot follow the high frequencies of the desired signal on line 131. This means simply that the voltage change produced in Cx over a single half cycle of the lowest frequency of interest in the input signal 101 must be less that required to change signal 131 by an amount corresponding to a single step of the reference generator 140. For input frequencies above this value, the equal positive and negative voltage excursions of a signal having a zero average value will cancel out at Cx over a full cycle, and will not produce enough change over that cycle to affect the output 102. But, when the average moves away from zero, the net change over a number of unequal half cycles pulls the capacitor voltage enough to affect the digital output code.

We claim as our invention:

1. A circuit for converting a differential analog input signal to a coded digital output signal, comprising:
   a level shifter for shifting the level of said differential input signal with respect to a ground potential;
   converter means coupled to said level shifter for converting said differential input signal to a single-ended analog signal referenced to said ground potential, said converter means including control means for varying the level of said single-ended analog signal with respect to said ground potential in response to a control signal such that an average value of said single-ended analog signal always corresponds to a zero value of said differential analog input signal;
   a reference generator for producing a plurality of reference signals between constant upper and lower reference values, one of said reference signals being a midpoint value between said upper and lower values;
   differencing means coupled to said converter means and to said reference generator for producing a difference signal representing the difference between said single-ended analog signal and said one reference signal having said midpoint value;
   an average detector coupled to said differencing means and to said converter means for determining and storing an average value of said difference signal, and for producing said control signal representing said average value;
   comparator means comprising a plurality of individual comparators each receiving said single-ended analog signal and a different one of said reference signals, said comparator means producing simultaneously a plurality of uncoded digital signals representing said shifted analog input signal, at least a particular one of said digital signals always representing a zero value of said differential analog input signal.

2. The circuit of claim 1, further comprising hold means for disabling said circuit in response to a hold signal.

3. The circuit of claim 2, wherein said hold means includes a gate for blocking said differential analog input signal.

4. The circuit of claim 2, wherein said hold means includes means in said average detector for blocking changes in said average value of said difference.

5. The circuit of claim 1, further comprising an encoder for converting said uncoded digital signals to a parallel coded digital signal.

6. The circuit of claim 1, wherein said single-ended converter comprises a differential amplifier having two sides both responsive to said shifted differential signal, said single-ended analog signal being taken from only one of said sides.

7. The circuit of claim 6, wherein said control means comprises a pair of transistors in series with respective sides of said differential amplifier and coupled in parallel to said control signal.

8. The circuit of claim 6, wherein said average detector includes a capacitor, responsive to a bidirectional current signal for increasing and decreasing the voltage across said capacitor, and wherein said control signal is proportional to said capacitor voltage.

9. The circuit of claim 8, wherein said differencing circuit produces said difference signal as said current signal.

* * * * *